(12) United States Patent
Kuan et al.

(10) Patent No.: US 11,031,376 B2
(45) Date of Patent: Jun. 8, 2021

(54) CHIP PACKAGE AND METHOD OF FORMING THE SAME

(71) Applicant: Taiwan Semiconductor Manufacturing Co., Ltd., Hsinchu (TW)

(72) Inventors: Hsaing-Pin Kuan, Hsinchu (TW); Ching-Hua Hsieh, Hsinchu (TW); Chih-Wei Lin, Hsinchu County (TW); Ching-Yao Lin, Hsinchu County (TW); Chun-Yen Lan, Hsinchu (TW); Kai-Ming Chiang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 15 days.

(21) Appl. No.: 16/513,739

(22) Filed: Jul. 17, 2019

(65) Prior Publication Data

US 2021/0020607 A1    Jan. 21, 2021

(51) Int. Cl.
| | |
|---|---|
| *H01L 23/48* | (2006.01) |
| *H01L 29/40* | (2006.01) |
| *H01L 25/065* | (2006.01) |
| *H01L 23/00* | (2006.01) |
| *H01L 23/28* | (2006.01) |
| *H01L 25/00* | (2006.01) |
| *H01L 23/538* | (2006.01) |
| *H01L 23/488* | (2006.01) |

(52) U.S. Cl.
CPC .......... *H01L 25/0657* (2013.01); *H01L 23/28* (2013.01); *H01L 23/488* (2013.01); *H01L 23/5385* (2013.01); *H01L 24/14* (2013.01); *H01L 25/50* (2013.01)

(58) Field of Classification Search
USPC ........................................ 257/737
See application file for complete search history.

(56) References Cited

U.S. PATENT DOCUMENTS

| | | |
|---|---|---|
| 9,000,584 B2 | 4/2015 | Lin et al. |
| 9,048,222 B2 | 6/2015 | Hung et al. |
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |

(Continued)

*Primary Examiner* — Niki H Nguyen
(74) *Attorney, Agent, or Firm* — JCIPRNET

(57) ABSTRACT

A chip package including a first semiconductor die, conductive pillars, a dielectric structure, a second semiconductor die and insulating encapsulant is provided. The first semiconductor die includes a top surface having a first region and a second region. The conductive pillars are disposed over the second region of the first semiconductor die. The dielectric structure includes a first support portion disposed on the first region of the semiconductor die, and a second support portion physically separated from the first semiconductor die. The second semiconductor die is stacked over the first support portion and the second support portion, and is electrically connected to the first semiconductor die through the conductive pillars. The insulating encapsulant encapsulates the first semiconductor die, the second semiconductor die, the dielectric structure and the conductive pillars.

20 Claims, 23 Drawing Sheets

(56) References Cited

U.S. PATENT DOCUMENTS

| | | |
|---|---|---|
| 9,368,460 B2 | 6/2016 | Yu et al. |
| 9,372,206 B2 | 6/2016 | Wu et al. |
| 9,496,189 B2 | 11/2016 | Yu et al. |
| 2013/0026655 A1* | 1/2013 | Lee .................... H01L 25/0655 257/777 |
| 2019/0221543 A1* | 7/2019 | Sung ....................... H01L 24/09 |

* cited by examiner

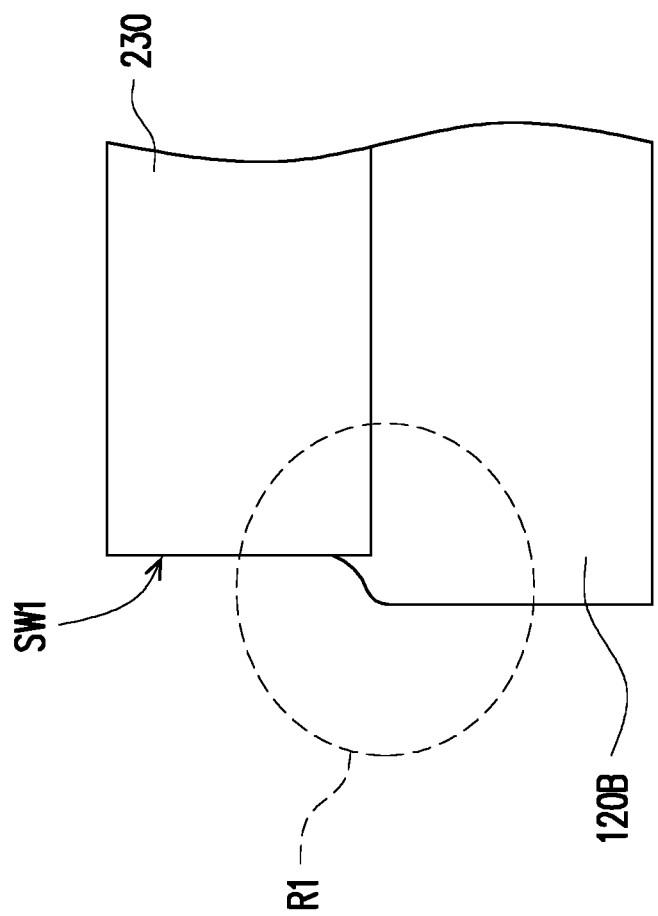

CHIP PACKAGE AND METHOD OF FORMING THE SAME

BACKGROUND

The semiconductor industry has experienced rapid growth due to continuous improvements in the integration density of various electronic components (i.e., transistors, diodes, resistors, capacitors, etc.). For the most part, this improvement in integration density has come from repeated reductions in minimum feature size, which allows more components to be integrated into a given area. With the growing demand for devices with smaller size, higher speed, greater bandwidth and high energy efficiency, there is a need for smaller and more creative packaging for integrating multiple chips into a single package. Die stacking is commonly used when integrating multiple chips into a package.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 7C illustrates an enlarged view of a portion of the chip package of FIG. 7A in accordance with some embodiments.

DETAILED DESCRIPTION

Figure 1:
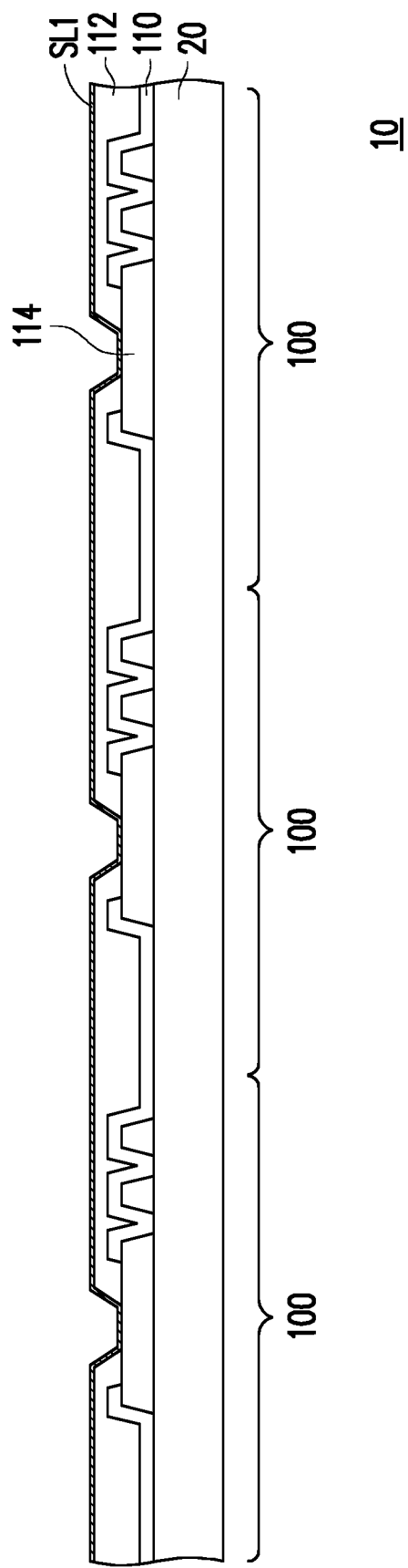
FIGS. 1 through 4 illustrate cross-sectional views of various processing steps during formation of a semiconductor die in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIGS. 1 through 4 illustrate cross-sectional views of various processing steps performed on the semiconductor wafer 10 during formation of the semiconductor dies 100. FIG. 1 illustrates a cross-sectional view of a semiconductor wafer 10 including multiple semiconductor dies 100. The semiconductor dies 100 may include a passivation layer 110, a dielectric layer 112 and conductive pads 114, and a seed layer SL1 formed over a semiconductor substrate 20. The semiconductor substrate 20 includes active components (e.g., transistors or the like) and passive components (e.g., resistors, capacitors, inductors or the like) formed therein and/or thereon. In some embodiments, the semiconductor substrate 20 is a crystalline silicon substrate. In other embodiments, the semiconductor substrate 20 is an elementary semiconductor substrate such as germanium; a compound semiconductor substrate including silicon carbon, gallium arsenic, gallium phosphide, indium phosphide, indium arsenide, and/or indium antimonide; an alloy semiconductor substrate including SiGe, GaAsP, AlInAs, AlGaAs, GaInAs, GaInP, and/or GaInAsP; or combinations thereof. Other semiconductor substrates such as multi-layered or gradient substrates may also be used as the semiconductor substrate 20.

Still referring to FIG. 1, the conductive pads 114 are formed over a front side of the semiconductor substrate 20 to electrically connect to the active components and passive components of the semiconductor substrate 20. The conductive pads 114 may be electrically connected to the semiconductor substrate 20 through an interconnect structure formed between conductive pads 114 and semiconductor substrate 20 (not shown). The side of the semiconductor die on which the conductive pads 114 are formed may be referred to as the top side (i.e. active surface) of the semiconductor die 100, and the side of the semiconductor substrate 20 opposite the conductive pads 114 may be referred to as the bottom side (i.e. back surface) of the semiconductor die 100. The conductive pads 114 may be aluminum pads, copper pads or other suitable metal pads. The conductive pads 114 may also be referred to as the input/output (I/O) pads of the semiconductor die 100, which is used for receiving/sending electrical signals from/to the external environment.

The passivation layer 110 is formed over the conductive pads 114. The passivation layer 110 is patterned to have a plurality of contact openings that partially reveal the conductive pads 114. The passivation layer 110 may be patterned through a photolithography process. The passivation layer 110 may be a silicon oxide layer, a silicon nitride layer, a silicon oxy-nitride layer or a dielectric layer formed by other suitable inorganic dielectric materials. The passivation layer 110 is formed by a deposition process that may include chemical vapor deposition (CVD), physical vapor deposition (PVDF), atomic layer deposition (ALD), combinations thereof, or another suitable process. The passivation layer 110 provides a protection function so that the structures formed thereunder are less likely to be damaged by subsequently performed processes.

The dielectric layer 112 is formed over the passivation layer 110 and into the opening of the passivation layer 110 to cover the partially revealed conductive pads 114. The dielectric layer 112 is patterned to form via openings partially revealing the conductive pads 114. The via openings formed in the dielectric layer 112 partially reveals the contact openings of the passivation layer 110. In some embodiments, the via openings may be formed to have a tapered shape in the cross-sectional view, and the via openings may be tapered to have a smaller diameter near the conductive pads 114. In some embodiments, dielectric layer 112 may be a polyimide (PI) layer, a polybenzoxazole (PBO) layer, or a dielectric layer formed by other suitable organic dielectric materials. In some embodiments, the dielectric layer 112 is formed by any acceptable deposition process, such as spin coating, CVD, laminating, the like, or a combination thereof, and is patterned through a photolithography process.

The seed layer SL1 is then formed on the dielectric layer 112 and the revealed portions of the conductive pads 114. That is, the seed layer SL1 is formed on the dielectric layer 112 conformal to the shape of the via openings. The seed layer SL1 may be formed using, for example, PVD or the like. In some embodiments, the seed layer SL1 is a metal layer, which may be a single layer or a composite layer comprising a plurality of sub-layers formed of different materials. In some embodiments, the seed layer SL1 includes a titanium layer and a copper layer over the titanium layer.

Figure 2:
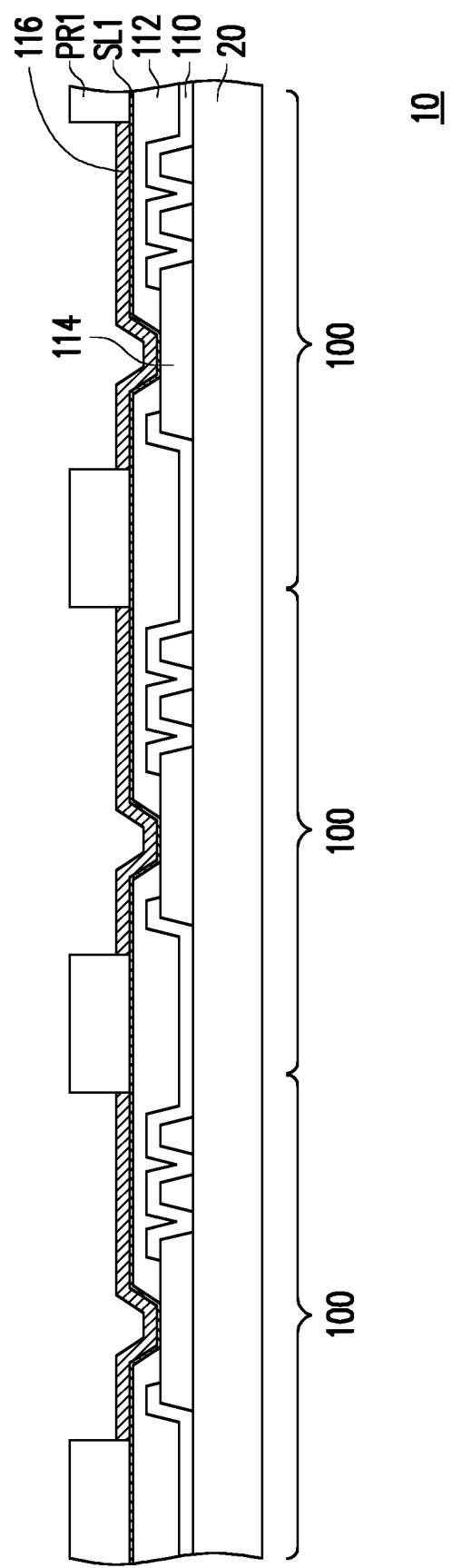

Referring to FIG. 2, after the seed layer SL1 is formed, a photoresist PR1 is then formed over the seed layer SL1 and patterned. The photoresist PR1 is patterned to form a plurality of openings above the conductive pads 114. The plurality of openings partially exposes the seed layer SL1 through the photoresist PR1. The pattern of the openings defines the shape of the conductive lines 116' (shown in FIG. 4) that will be formed therein in a later processing stage. For example, the plurality of openings may be trenches which extend toward an edge (e.g. the right edge) of each of the semiconductor die 100. In some embodiments, the photoresist may be formed by spin coating or the like and may be exposed to light for patterning.

After the photoresist PR1 is formed and patterned, a conductive material 116 is then formed in the openings of the photoresist PR1 and on the exposed portions of the seed layer SL1. The conductive material 116 may be formed by plating, such as electroplating, electroless plating, or the like. The conductive material 116 may be formed of a metal such as copper, titanium, tungsten, aluminum, or the like. In some embodiments, the conductive material 116 is formed as a routing process to reroute all the conductive pads 114 closer to an edge (e.g. right edge) of the semiconductor die 100.

Figure 3:
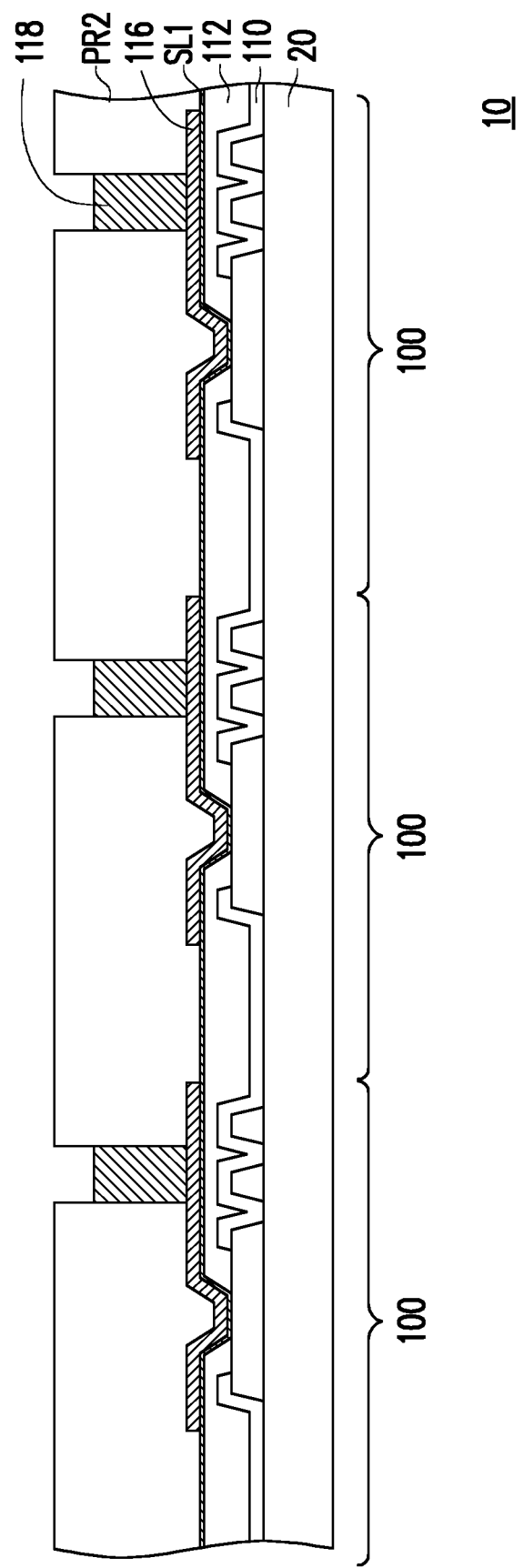

Referring to FIG. 3, after the conductive material 116 is formed in the openings of the photoresist PR1 and on the seed layer SL1, the photoresist PR1 is removed. In some embodiments, the photoresist PR1 may be removed by any acceptable process, such as by an ashing process, a stripping process, or the like. After the photoresist PR1 is removed, another photoresist PR2 is formed over the seed layer SL1 and the conductive material 116. The photoresist PR2 is then patterned to form via openings to reveal the right end portion of the conductive material 116, for example.

A conductive material is then formed in the via openings of the photoresist PR2 and on the exposed portions of the conductive material 116 such that conductive pillars 118 are formed on the conductive material 116. In some embodiments, the conductive pillars 118 may be between about 10 μm to about 1000 μm from the right edge of the semiconductor die 100. The conductive pillars 118 may have a diameter of between about 5 μm to about 500 μm. In some embodiments, the conductive pillars 118 are formed of a metal such as copper, titanium, tungsten, aluminum, or the like. The conductive pillars 118 may be formed using process similar to the process of forming conductive material 116 as described above and is not repeated herein. The conductive pillars 118 may be lined along an edge (e.g. right edge) of the semiconductor die 100 in a manner shown in FIG. 6B, for example.

Figure 4:
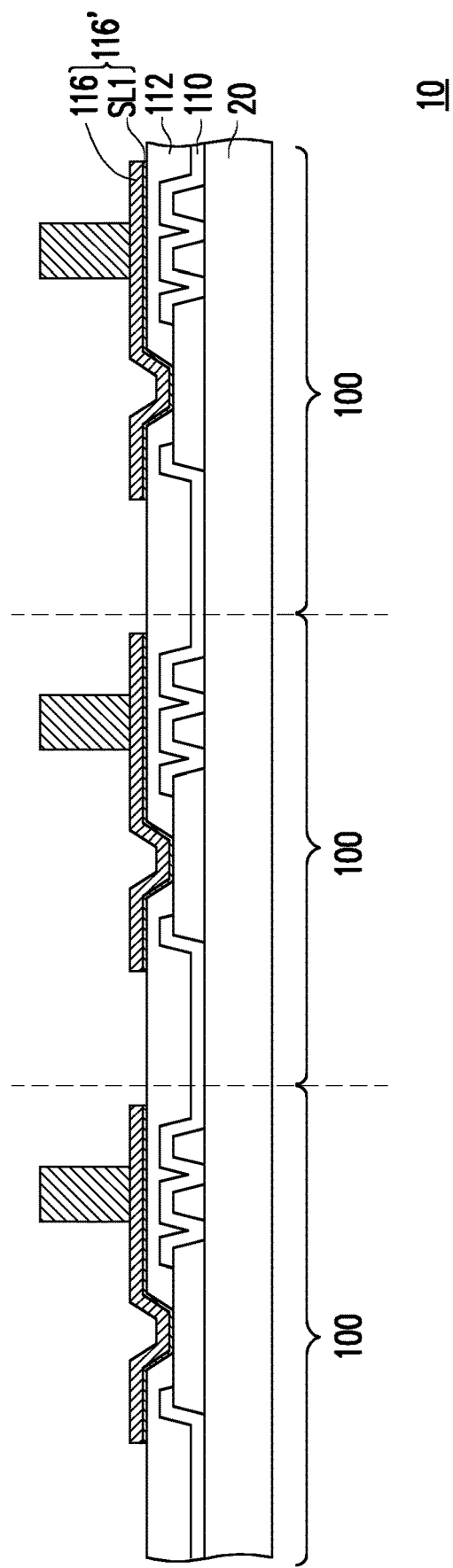

Referring to FIG. 4, the photoresist PR2 is removed and portions of the seed layer SL1 which are not covered by the conductive materials 116 are also removed. In some embodiments, the photoresist PR2 may be removed by any acceptable process, such as by an ashing process, a stripping process, or the like. After the photoresist PR2 is removed, the exposed portion of the seed layer SL1 may then be removed by any acceptable process. In some embodiments, the exposed portion of the seed layer SL1 may be removed by etching process such as wet etching, dry etching, or the like. After the portions of the seed layer SL1 which are not covered by the conductive material 116 are removed, the remaining portion of the seed layer SL1' and the conductive material 116 formed thereon are collectively referred to as conductive lines 116'.

After the seed layer SL1 is removed, a singulation process is performed on the wafer 10 to separate the plurality of semiconductor dies 100 into individual dies. During the singulation process, the wafer 10 may be diced along the scribe lines (dashed lines shown in FIG. 4) such that singulated semiconductor dies 100 are obtained. The semiconductor die 100 may be a memory die (e.g. high bandwidth memory (HBM) die, dynamic random access memory (DRAM) die, static random access memory (SRAM) die etc.). In some embodiments, the semiconductor die 100 may be any semiconductor die which has a low I/O count such that all the conductive pillars 118 connected to the conductive pads 114 can be routed to an edge region of the semiconductor die 100. The edge region may cover an area of between about 5% to about 50% of the total top surface area of the semiconductor die 100.

Figure 5:
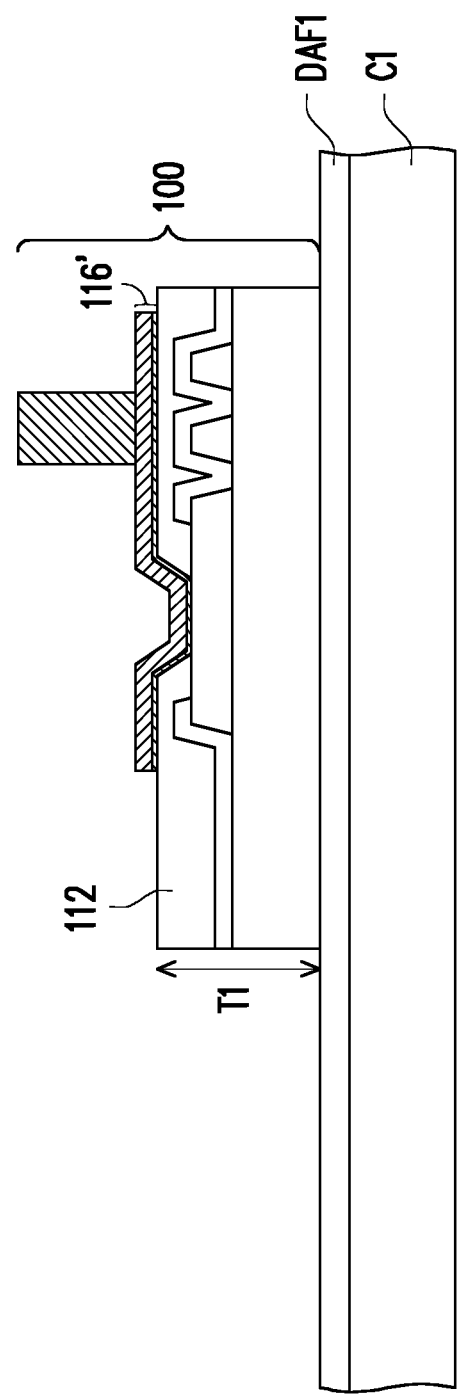
FIGS. 5, 6A, 7A, and FIGS. 8 through 10 illustrate cross-sectional views of various processing steps during formation of a chip package in accordance with some embodiments.

Referring to FIG. 5, a carrier C1 such as a glass substrate is provided. A layer of die-attach film DAF1 is blanketly attached over the carrier C1. The semiconductor die 100 is then attached to the carrier C1 through the die-attach film DAF 1. The semiconductor die 100 may have a thickness T1 from the back surface to the top surface of the dielectric layer 112. In some embodiments, a de-bonding layer (not shown) such as a light-to-heat conversion (LTHC) release layer may be formed between the die-attach film DAF1 and the carrier C1. Although a single semiconductor die 100 is shown, the packaging process described herein may be a wafer-level packaging process having multiple semiconductor dies 100 attached to the carrier C1 through the die-attach film DAF1. Furthermore, although one semiconductor die 100 is shown for each package in the present disclosure, the number of semiconductor die 100 is not limited to one. That is, in some embodiments, one package may include two identical semiconductor dies 100 positioned such that their conductive pillars 110 are aligned.

Figure 6A:
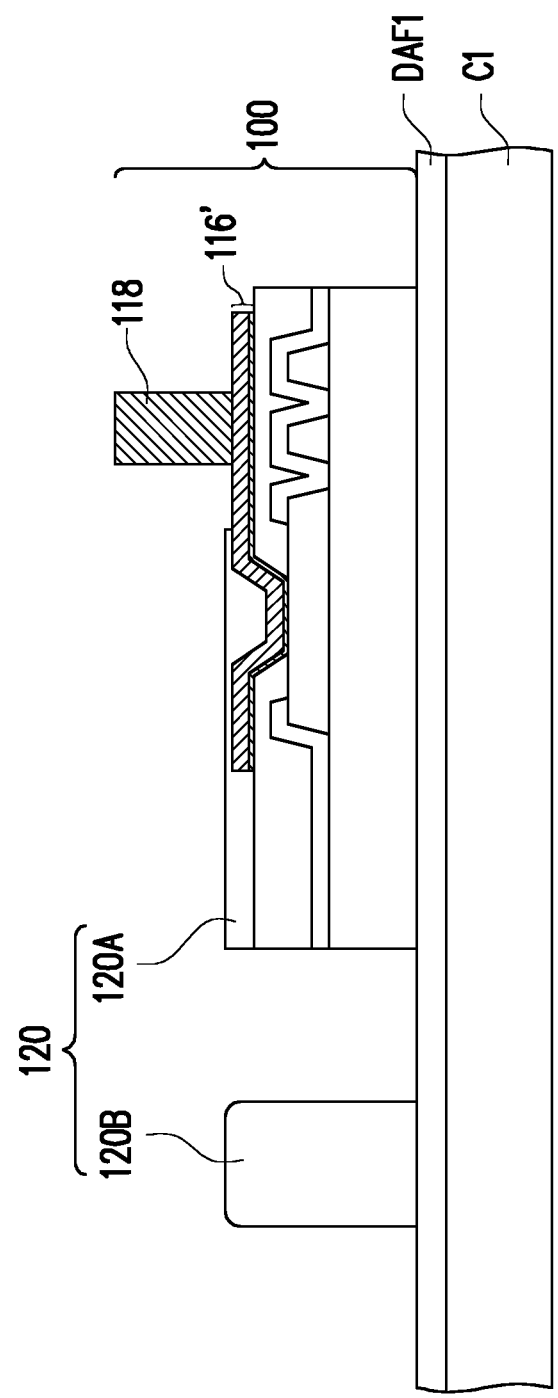
Figure 6B:
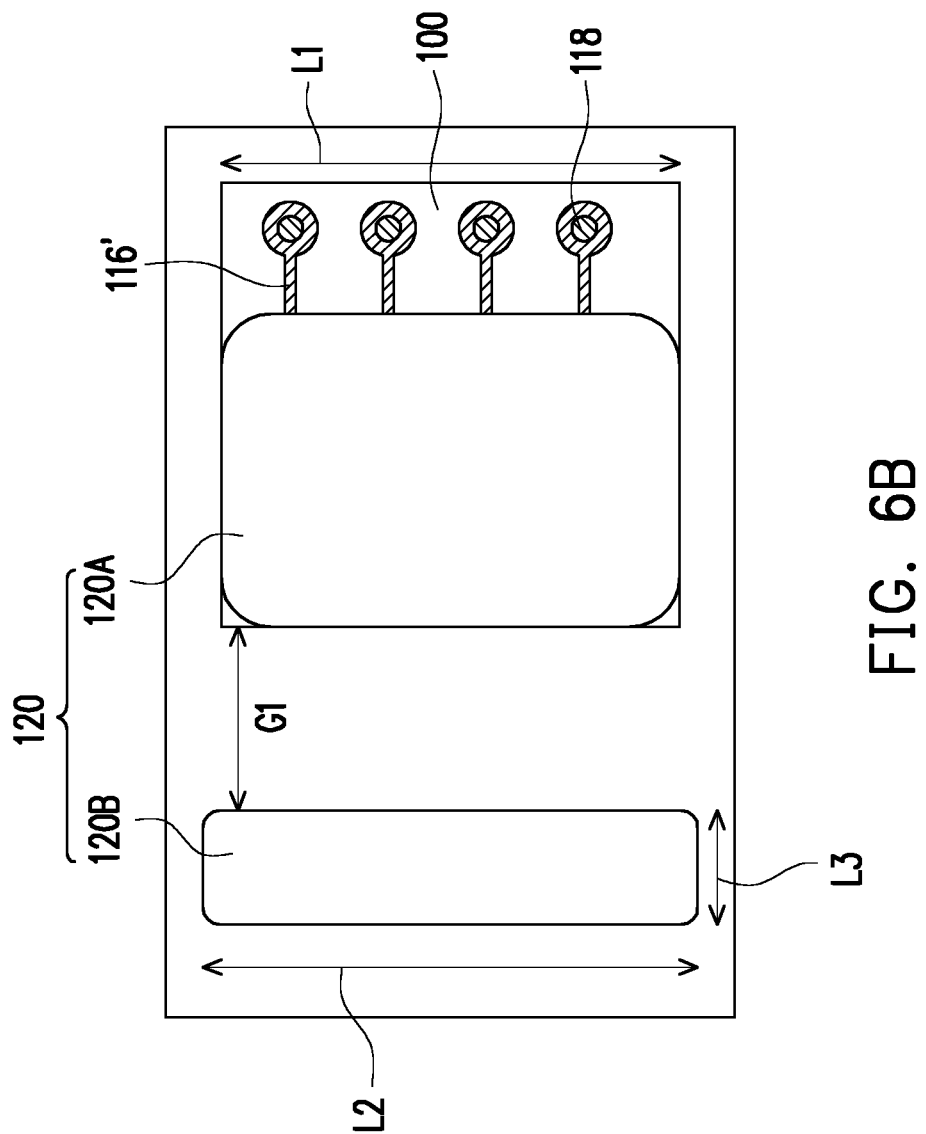
FIGS. 6B and 7B illustrate top views of the chip package of FIG. 6A and FIG. 7A respectively in accordance with some embodiments.

After the semiconductor die 100 is attached onto the die-attach film DAF1, dielectric structures 120 are formed on the semiconductor die 100 and the die-attach film DAF1, as shown in FIGS. 6A and 6B. Referring to both FIGS. 6A and 6B, the dielectric structures 120 include first support portion 120A and second support portion 120B. The first and second support portions 120A and 120B are used to adhere and support a semiconductor die 200 (shown in FIG. 7A) that is to be stacked on the semiconductor die 100 in a later process. That is, the first support portion 120A may adhere to one edge of the semiconductor die 200 while the second support portion 120B adheres to the opposite edge of the semiconductor die 200. Details of stacking the semiconductor die 200 will be described in further detail below referring to FIG. 7A through 7C. The process of forming the dielectric structure 120 is be discussed in detail below.

After the semiconductor die 100 is placed on the die-attach film DAF1, a three-dimensional (3D) printing process is used to deposit patterned dielectric materials on the die-attach film DAF1 beside the semiconductor die 100. The dielectric material deposited on the carrier C1 is referred to as the second support portion 120B of the dielectric structure 120. The second support portion 120B may be deposited layer-by-layer on the surface of the die-attach film DAF1 until it reaches a height around the thickness T1 of the semiconductor die 100. At the height of T1, the layering process of the first support portion 120A begins on the semiconductor die 100. The layering of the first support portion 120A together with the layering of second support portion 120B are performed until the final height T3 of second support portion 120B and final thickness T2 of first support portion 120A are reached. That is, at the height of T1, each layer formed thereafter includes layers of both the first support portions 120A and the second support portions 120B. In this way, top surfaces of the first support portion 120A and second support portion 120B may be substantially leveled. In some embodiments, the entire first support portion 120A may be printed first followed by the entire second support portion 120B, or vice versa.

In some embodiment, the 3D printing process may be an inkjet process, a dispensing process, a printing process, and the like. In some embodiments, the material of the dielectric structure 120 may be a b-stage glue such as adhesive, epoxy, and the like. In some embodiments, the material of the dielectric structure 120 may be an epoxy-based material that has a sufficient stiffness and adhesive properties after being partially cured. The dielectric structure 120 may be partially cured during the layering process using UV irradiation or heat.

Referring to FIG. 6B, the first support portion 120A may cover a first region of the top surface of semiconductor die 100. In detail, the first support portion 120A may partially cover the dielectric layer 112 and the conductive lines 116' leaving the conductive pillars 118, part of the conductive lines 116' and part of the dielectric layer 112 exposed. The first support portion 120A are formed to provide a buffer between the semiconductor die 200 and the conductive lines 116' and to provide a level top surface so that the semiconductor die 200 may be properly placed on the semiconductor die 100. The first support portion 120A may have a thickness T2 of between about 2 μm to about 20 μm. Due to the topography of the top surface of the dielectric layer 112 and the top surface of the conductive lines 116', the first support portion 120A may have varying thickness (see FIG. 6A).

The second support portion 120B is formed beside the semiconductor die 100 on the die-attach film DAF1 and is separated from the semiconductor die 100 by a first gap G1. In some embodiments, the second support portion 120B may be a cuboid having rounded edges and/or rounded corners. The second support portion 120B may have a length L2 perpendicular to the gap G1 and a width L3. The length L2 of the second support portion 120B may be longer or shorter than the length L1 of the semiconductor die 100, depending on size of the semiconductor die 200 which will be stacked on in a later process described below. In some embodiments, the length L2 is provided such that it is greater than the dimension of the semiconductor die 200 in the same direction. Additionally, the second support portion 120B may be provided with a width L3 to provide sufficient contact area between the second semiconductor die 200 and the second support portion 120B. In some embodiment, the second support portion 120B is in contact with between about 5% to about 80% of the bottom surface of the semiconductor die 200. In some embodiments, the position, length L2 and width L3 of the second support portion 120B is chosen such that it extends beyond edges of the semiconductor die 200 when the semiconductor die 200 is stacked on top (see FIG. 7B). In some embodiments, the gap G1 between the second support portion 120B and the semiconductor die 100 is provided sufficiently so that encapsulating materials may flow through and fill the gap G1 without forming void regions therein. In some embodiments, the gap G1 may be between about 50 μm to about 10000 μm. In some embodiment, the ratio of L2:G1 may be between about 0.1 to about 10.

Figure 7A:
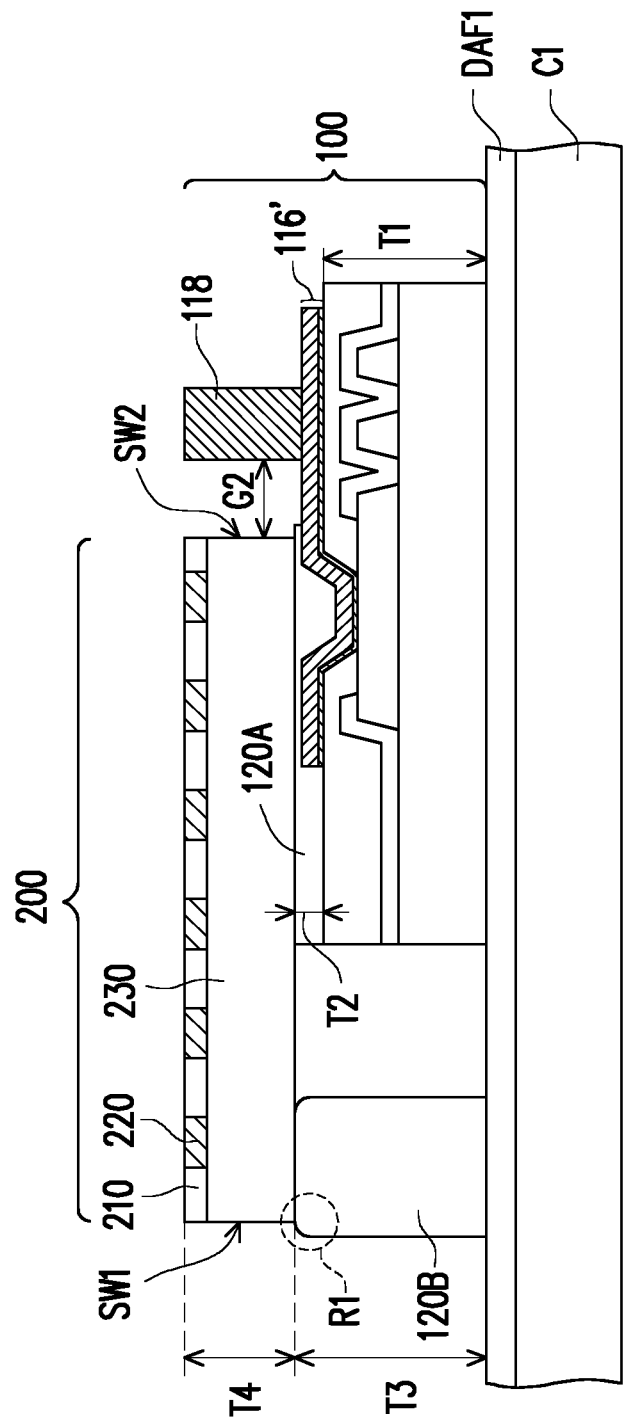

Referring to FIG. 7A, the semiconductor die 200 is stacked on the first support portion 120A and the second support portion 120B and positioned beside the conductive pillars 118 of the semiconductor die 100. The semiconductor die 200 may include a semiconductor substrate 230 and conductive pads 220 provided on the semiconductor substrate 230. The semiconductor substrate 230 may be formed of any semiconductor substrate similar to semiconductor substrate 20 discussed above. The semiconductor substrate 230 includes active components (e.g., transistors or the like) and passive components (e.g., resistors, capacitors, inductors or the like) formed in or on the front side of the semiconductor substrate 230. In some embodiments, the semiconductor die 200 are System on Chip (SoC) dies. In some alternative embodiments, the semiconductor die 200 may be logic dies, which may be Central Processing Unit (CPU) dies, Micro Control Unit (MCU) dies, Input-Output (IO) dies, Base-Band (BB) dies, or Application processor (AP) dies. In some embodiments, the semiconductor die 200 may have a thickness T4 between about 0.05 mm to about 0.8 mm.

In FIG. 7A, the semiconductor die 200 is stacked on the semiconductor die 100 and the second support portion 120B such that the bottom surface of the semiconductor die 200 is adhered to the top surfaces of the first support portion 120A and the second support portion 120B. That is, the bottom surface of the semiconductor substrate 230 may directly contact the top surface of the first support portion 120A and the top surface of the second support portion 120B. Further, at this stage, the gap between the second support portion 120B and the semiconductor die 100 exposes a portion of the bottom surface of the semiconductor substrate 230.

The conductive pads 220 formed on the semiconductor die 200 may be regarded as I/O connection pads of the semiconductor die 200. The conductive pads 220 are embedded in dielectric layer 210. In some embodiments, the semiconductor die 200 may have a number of conductive pads 220 (i.e. I/O counts) higher than the number of conductive pillars 118. The conductive pads 220 may be evenly distributed over the top surface of the semiconductor die 200. In some embodiments, the conductive pads 220 may cover a region of between 5% to 50% of the top surface area of the semiconductor die 200. In some embodiment, the number of conductive pads 220 is between about 0.1 to 100 times the number of conductive pillars 118.

Figure 7B:
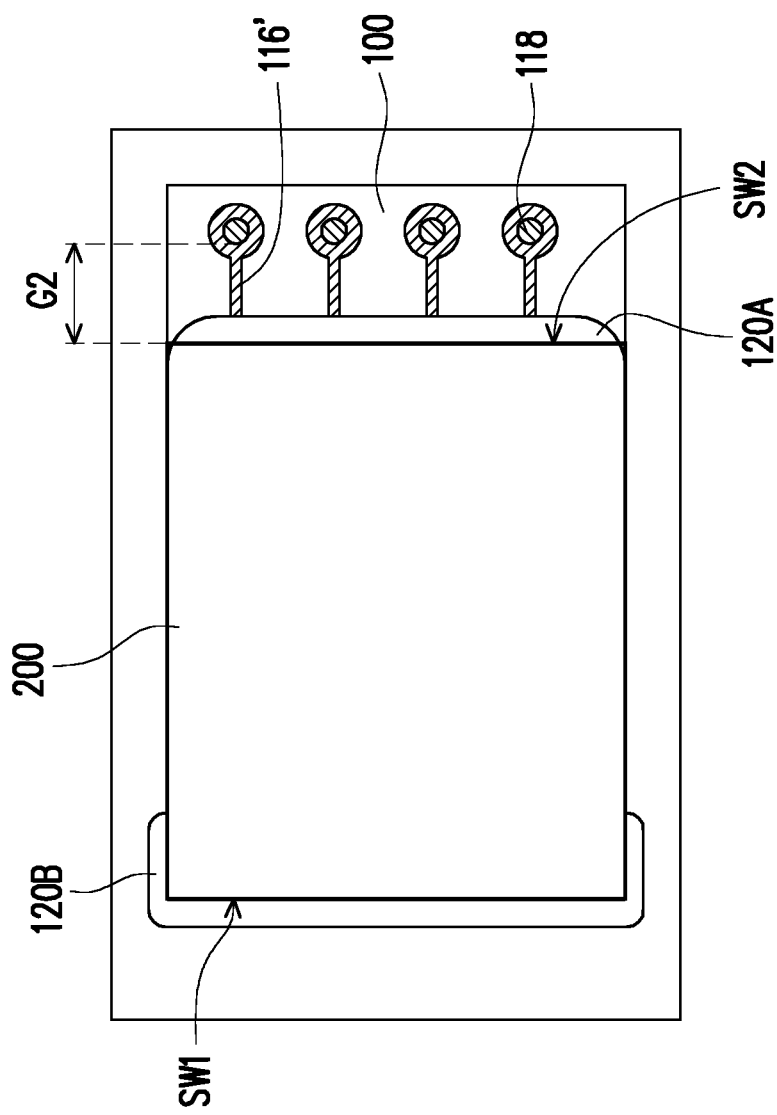

In some embodiments, the semiconductor die 200 may cover a larger area than the semiconductor die 100. The semiconductor die 200 may positioned to be separated from the conductive pillars 118 by a gap G2. In some embodiment, the gap G2 may be between about 50 μm to about 500 μm. In some embodiments, the first sidewall SW1 of the semiconductor die 200 may be substantially parallel to an edge of the second support portion 120B, and the second sidewall SW2 of the semiconductor die 200 opposite the first sidewall SW1 may be substantially parallel to an edge of the first support portion 120A, as shown in FIG. 7B.

The second supporting portion 120B may be provided such that it contacts two corner edges of the bottom surface of the semiconductor die 200. By adhering to the corner edges of the semiconductor die 200, the second support portion 120B may prevent the portion of the semiconductor die 200 overhanging the semiconductor die 100 from being warped upwards. That is, both the corner edges of the semiconductor die 200 that is away from the semiconductor die 100 may be held down by the second support portion 120B having adhesive properties. Furthermore, as stated above, the second support portion 120B may extend beyond the edges of the semiconductor die 200, and therefore, the semiconductor die 200 does not completely overlap the second support portion 120B in a top view (e.g. FIG. 7B). As shown in FIGS. 7A and 7B, for example, the first support portion 120A and the second support portion 120B extend beyond the sidewall SW1 and sidewall SW2 of the second semiconductor die 200, respectively. FIG. 7C illustrates an enlarged view of the edge region R1 showing an interface between an edge of the semiconductor die 200 and the second support portion 120B.

Referring to FIG. 7C, an edge of the semiconductor substrate 230 of the semiconductor die 200 is stacked on the 120B. Due to the second support portion 120B being only partially cured and not fully solidified, the second support portion 120B may slightly deform to wrap around the edges of the semiconductor die 200 and adhered to sidewall S1 of the semiconductor die 200. Although not shown, the first support portion 120A extending beyond sidewall SW2 may similarly wrap around an edge of the semiconductor die 200 and be in contact with the sidewall SW2.

Figure 8:
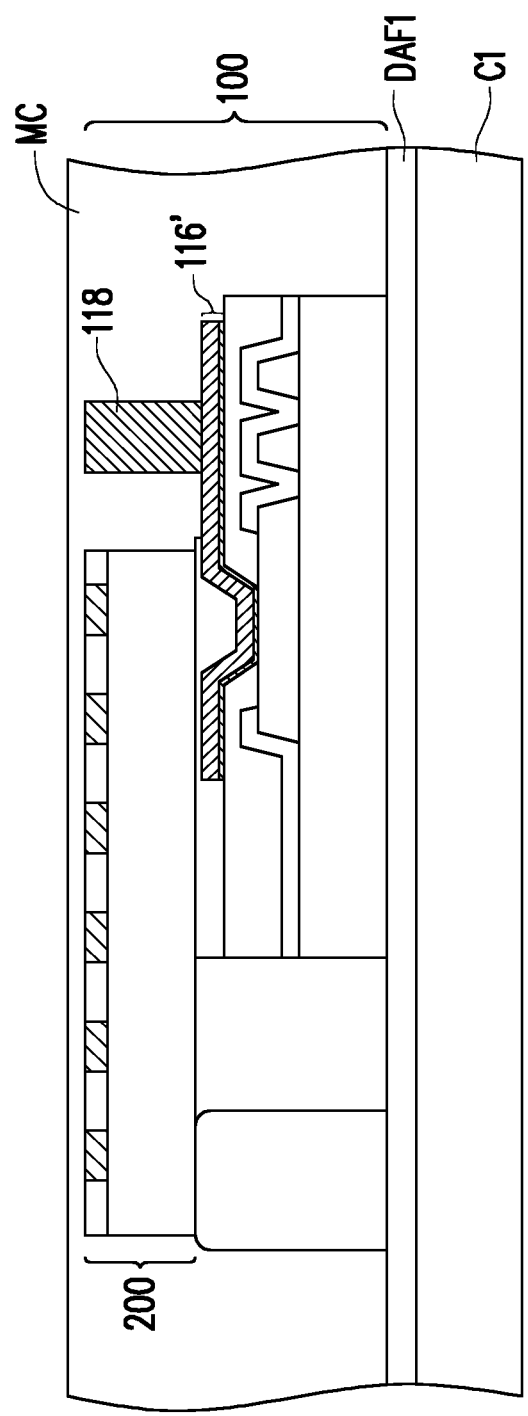

In FIG. 8, after stacking the semiconductor die 200, an insulating encapsulant MC is deposited to encapsulate the semiconductor die 100, the first and second support portion 120A and 120B, and the second semiconductor die 200 and the conductive pillars 118. The insulating encapsulant MC fills the spaces under the semiconductor die 200, the gap between the semiconductor die 200 and the conductive pillars 118, and the gaps between each of the conductive pillars 118. In other words, all exposed surfaces of the semiconductor die 100, the semiconductor die 200 and the first and second support portion 120A and 120B are covered by the insulating encapsulant MC. The insulating encapsulant MC may be a molding compound, epoxy, or the like, and may be applied by a molding process (e.g. compression molding, transfer molding, or the like). The insulating encapsulant MC may be applied to a level covering the top surfaces of the semiconductor dies 200 and conductive pillars 118. By providing a sufficient gap G1 between the second support portion 120B and the semiconductor die 100, as discussed above, the insulating encapsulant MC may fill the space between the second support portion 120B and the semiconductor die 100 and reduces the possibility of void trapped therein. A curing process may then be performed to cure the insulating encapsulant MC and fully cure the dielectric structure 120 embedded in the insulating encapsulant MC.

Figure 9:
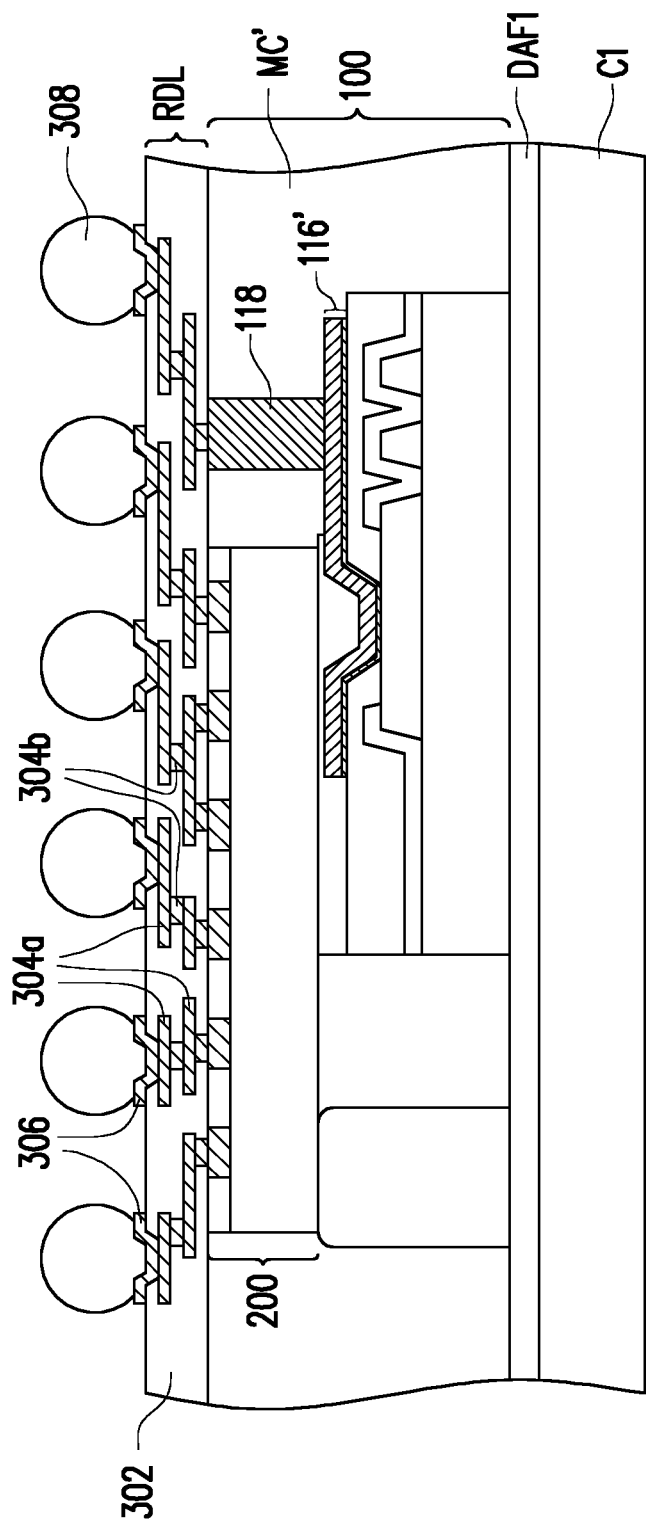

In FIG. 9, the insulating encapsulant MC is then partially removed to expose the top surfaces of the dielectric layer 210, the conductive pads 220 and the conductive pillars 118. In some embodiment, when the conductive pillars 118 is taller than the top surface of the semiconductor die 200, the conductive pillars 118 is also partially removed. Preferably, the top surface of the remaining insulating encapsulant MC' is substantially leveled with the exposed top surfaces of the dielectric layer 210, the conductive pads 220 and the conductive pillars 118. The partial removal of the insulating encapsulant MC may be performed by a grinding process and/or a planarization process such as a chemical mechanical polishing (CMP) process.

Next, a redistribution circuit structure RDL is formed on the top surfaces of the conductive pillars 118, the top surface of the insulating encapsulation MC', and the top surface of the semiconductor dies 200. The redistribution circuit structure RDL is fabricated to electrically connect with one or more connectors underneath. Here, the afore-said connectors may be conductive pads 220 and conductive pillars 118 embedded in the insulating encapsulant MC'. The redistribution circuit structure RDL may include a plurality of redistribution wirings and a plurality of patterned dielectric layers 302 stacked alternately. Here, the redistribution wirings may include conductive traces 304a and conductive vias 304b stacked alternately. For example, the material of the redistribution wirings may be copper and the material of the patterned dielectric layers 302 may include polyimide (PI), polybenzoxazole (PBO) or other suitable dielectric material. Furthermore, the conductive pillars 118 are electrically connected to the semiconductor die 200 through the redistribution circuit structure RDL.

Figure 10:
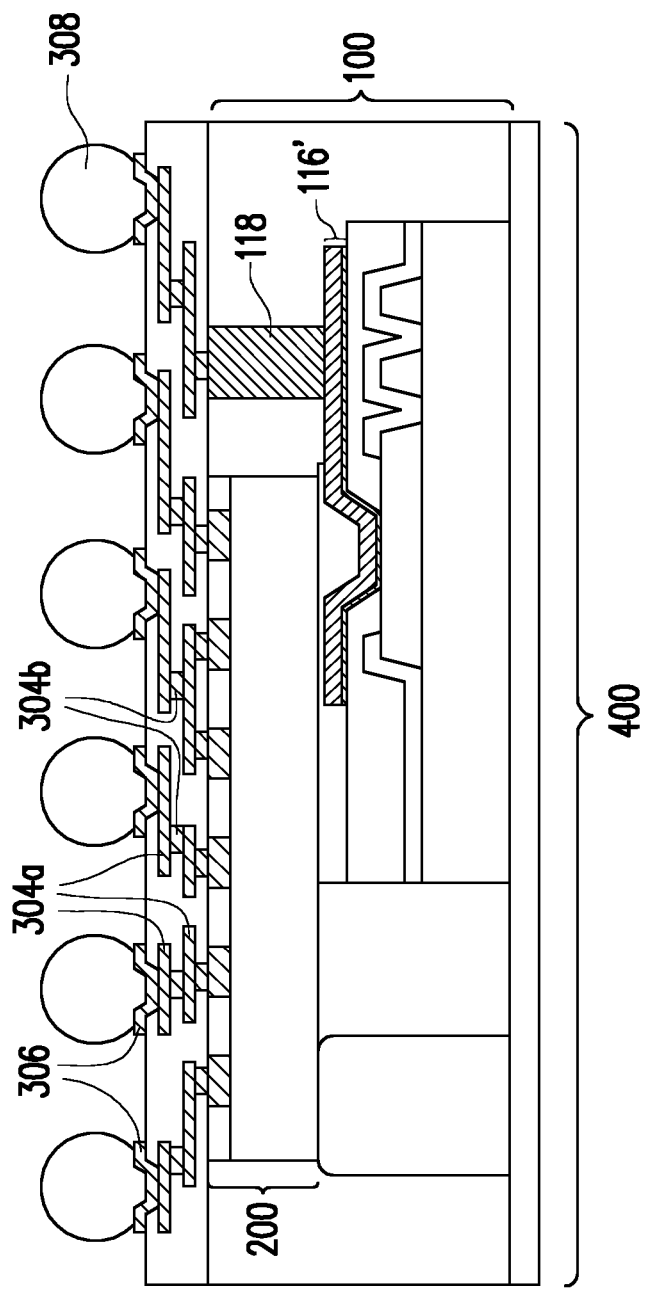

After forming the redistribution circuit structure RDL, a plurality of conductive features electrically connected to the redistribution circuit structure RDL are formed. Here, the conductive features may include under-bump metallurgies (UBM) 306 and conductive connectors 308 formed on the UBM 306. In some embodiments, the conductive connectors 308 may be ball grid array (BGA) connectors, solder balls, metal pillars, controlled collapse chip connection (C4) bumps, micro bumps, or the like. The conductive connectors 308 may include conductive materials such as solder, copper, aluminum, gold, nickel, silver, palladium, tin, or the like, or the combination thereof. In some embodiments, the conductive connectors may be formed by initially forming a layer of solder on the UBM 306 followed by a reflow process. After forming the conductive connectors 306, the carrier C1 may be detached from the package wafer and individual chip packages having at least one semiconductor die 100 and at least one semiconductor die 200 packaged therein may be singulated to form a chip package 400 with a front side redistribution structure, as shown in FIG. 10.

In some embodiments, a dielectric structure may be provided with a pattern different from the dielectric structure 120 of FIG. 6B. Specifically, the second support portion of the dielectric structure may be 3D printed to have different shapes, sizes and numbers from the second support portion 120B of FIG. 6B discussed above. FIGS. 11A through 11D illustrates some embodiments of second support portions 140A through 140D having different shapes, sizes and numbers from second support portion 120B. The support portions 140A through 140D may be formed on the die-attach film DAF1 after placement of the semiconductor die 100 on the carrier C1 as discussed above with reference to FIG. 5. The support portions 140A through 140D may be formed using the same 3D printing process and same material as described above for the second support portion 120B.

Figure 11A:
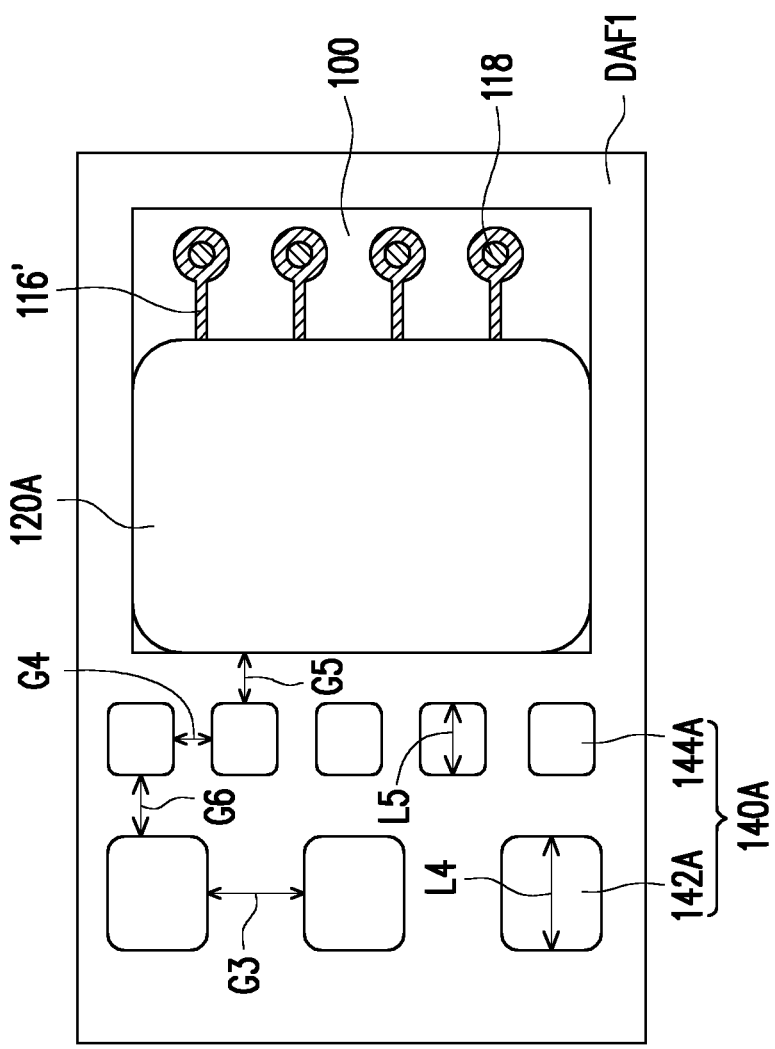
FIGS. 11A through 11D illustrate top views of the chip package in accordance with some alternative embodiments.

Referring to FIG. 11A, the second support portion 140A includes multiple support pillars 142A and multiple support pillars 144A having identical height to provide a substantially even surface to attach the semiconductor die 200. The support pillars 142A are provided on the left side furthest away from the semiconductor die 100 while the support pillars 144A are disposed between semiconductor die 100 and the support pillars 142A. A number of the support pillars 142A may be arranged in a line along a direction parallel with the left edge of the semiconductor die 100. Each of the support pillars 142A may be provided with a lateral dimension L4 and positioned have a gap G3 from the immediately adjacent support pillars 142A. The support pillars 142A may be used to provide sufficient support and/or adhesives to the left edge of the semiconductor die 200. It should be noted that, two of the support pillars 142A contacts to corner regions of the bottom surface of the semiconductor die 200. In some embodiments, the ratio of G3:L4 may be between about 0.05 to about 20.

Still referring to FIG. 11A, a number of the support pillars 144A may be arranged in a line along a direction parallel with the left edge of the semiconductor die 100. Each of the support pillars 144A may be provided with a lateral dimension L5 smaller than L4 of the support pillars 142A and positioned to have a gap G4 from the immediately adjacent support pillars 144A. Moreover, the support pillars 144A are positioned to have a gap G6 from the support pillars 142A and a gap G5 from the semiconductor die 100. The support pillars 144A may be used to provide sufficient support and/or adhesives to the central part of the semiconductor die 200. In some embodiments, the gaps G4, G5 and G6 are chosen to allow encapsulating materials to flow through and reduce the possibility of void regions being formed therein. In some embodiments, the ratio of L5:G4 may be between about 0.05 to about 20. In some embodiments, the ratio of G4:G5 may be between about 0.05 to about 20 and the ratio of G4:G6 may be between about 0.05 to about 20. In some embodiments, a distance (e.g., the gap G5) between the semiconductor die 100 and an immediately adjacent support pillar 144A may be between about 100 μm to about 3000 μm. In some embodiments, a distance (e.g., the gap G4 or the gap G6) between immediately adjacent pairs of the support pillars (e.g., support pillars 142A/144A) may be between about 100 μm to about 3000 μm.

Figure 11B:
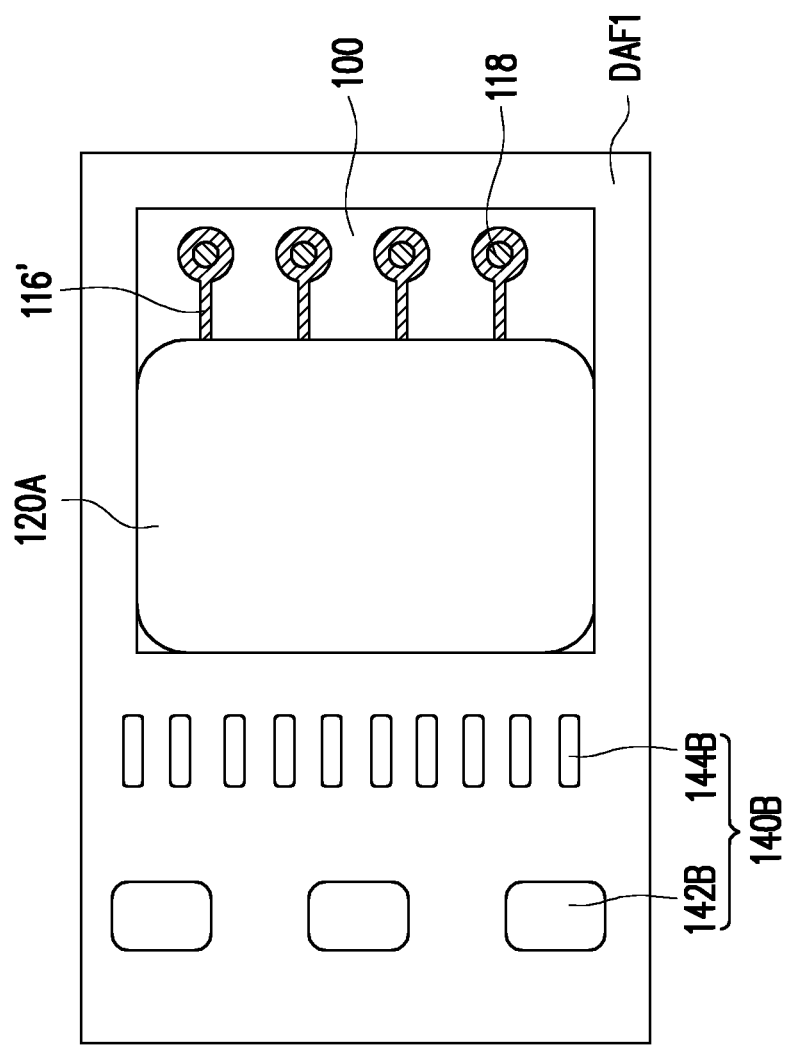

In an alternative embodiment shown in FIG. 11B, the support portion 140B includes support pillars 142B and support fins 144B having identical heights. The support pillars 142B may be similar to support pillars 142A and is not repeated herein. The support fins 144B may be different from support pillars 142A and 144A in that the length to width ratio is much larger. For example, the length to width ratio of the support fins 144B may be between about 0.1 to about 10.

Figure 11C:
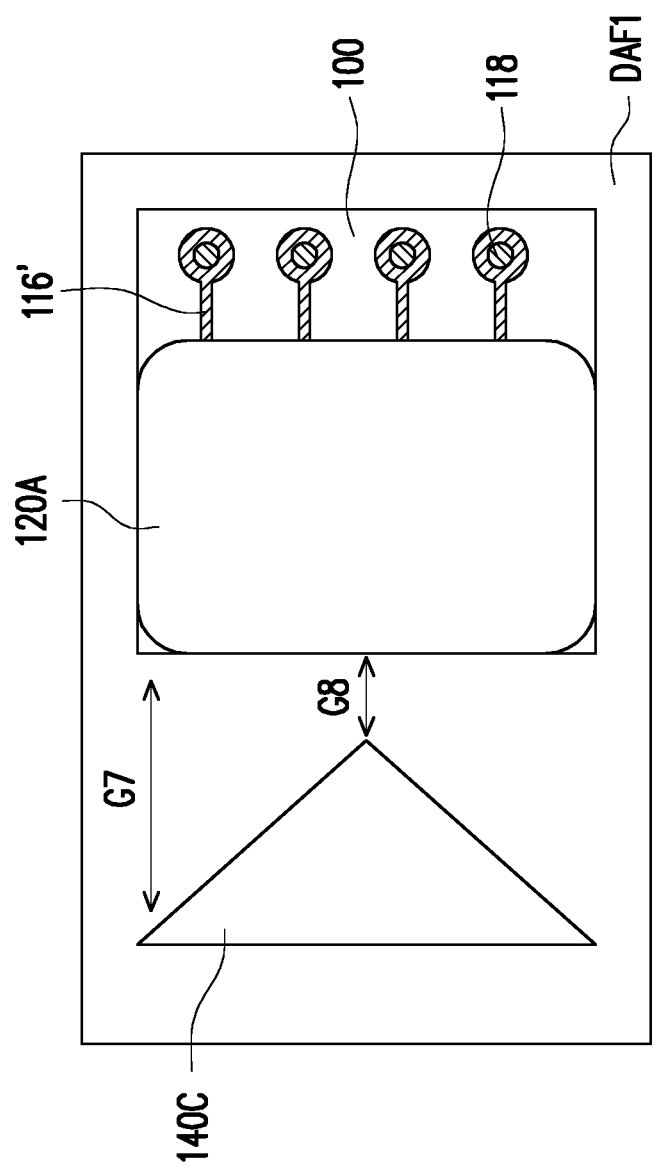

In another alternative embodiment shown in FIG. 11C, the second support portion 140C spaced apart from semiconductor 100 is provided. Similar to the second support portion 120B, the second support portion 140C includes only one supporting structure. However, instead of being a cuboid, the second support portion 140C is a triangular post having a triangular top surface and a triangular bottom surface. The second support portion 140C includes one sidewall that is parallel to the left edge of the semiconductor die 100 and a vertex facing the semiconductor die 100. By positioning the second support portion 140C in such a manner, two corner regions of the bottom surface of the semiconductor die 200 may be in contact with the second support portion 140C. Further, the vertex facing the semiconductor die 100 is provided to be nearest to the middle part of the left edge of the semiconductor die 100 with a gap G8 while two other vertices are separated from the semiconductor die 100 by larger gap G7. The larger gap G7 allows encapsulating material to flow easily into the narrower gap G8.

Figure 11D:
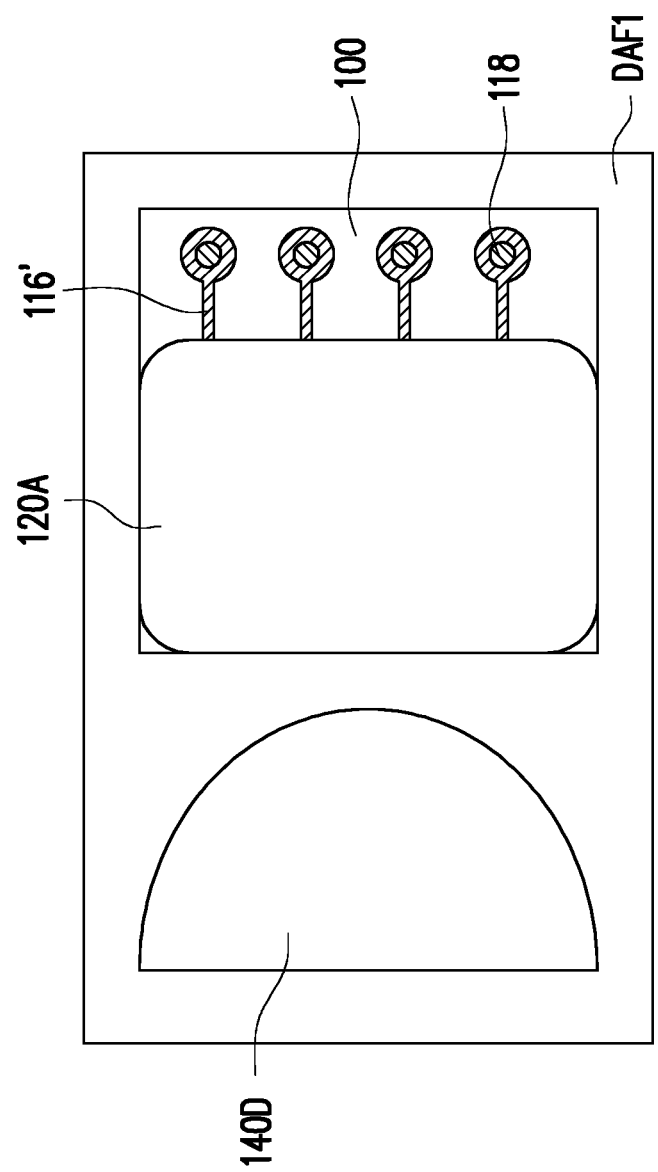

In yet another alternative embodiment shown in FIG. 11D, the second support portion 140D spaced apart from semiconductor 100 is provided. Similar to the second support portion 120B, the second support portion 140D includes only one supporting structure. However, instead of being a cuboid, the second support portion 140D is a semi-cylindrical post having one sidewall being parallel to the left edge of the semiconductor die 100 and a curved surface facing the semiconductor die 100. By positioning the second support portion 140D in such a manner, two corner regions of the bottom surface of the semiconductor die 200 may be in contact with the second support portion 140D, and encapsulating material may easily flow into the space between the second support portion 140D and the semiconductor die 100.

Figure 12:
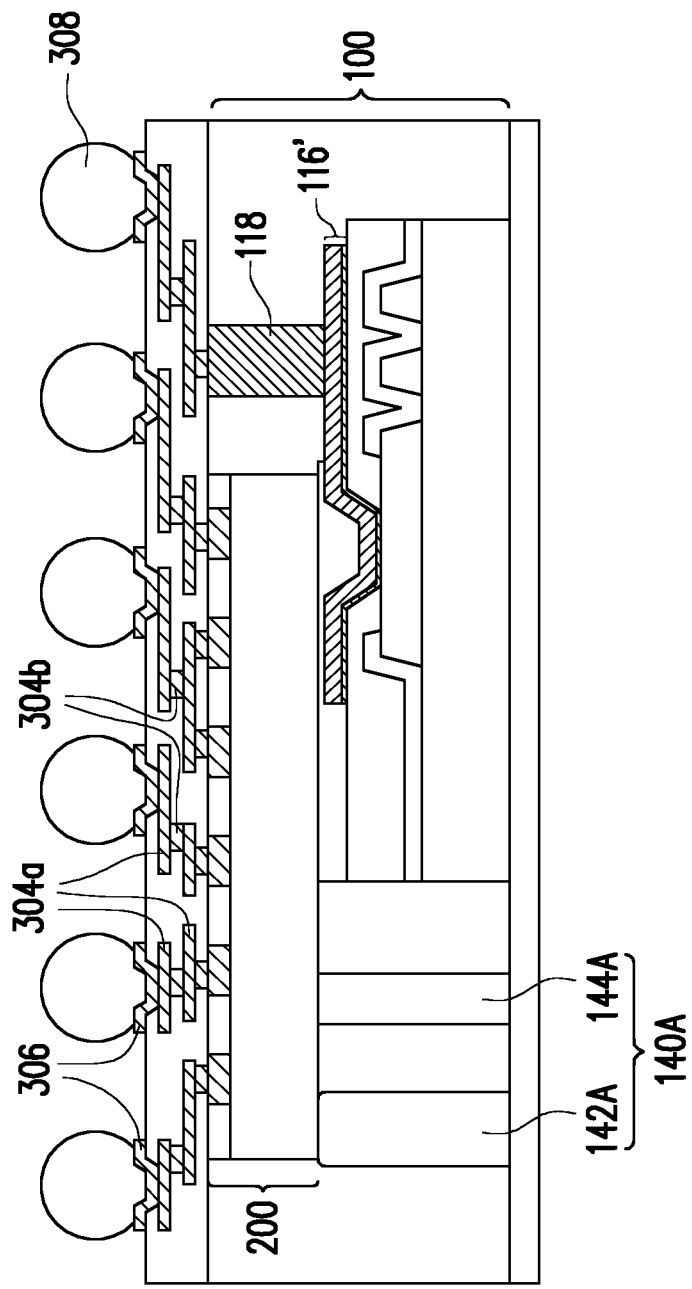
FIG. 12 illustrates cross-sectional view of a chip package in accordance with some embodiments.

FIG. 12 shows cross-sectional views of a chip package 400' having support pillars 142A and 144B corresponding to the pattern of the second support portion 140A shown in FIG. 11A. Although two columns of support pillars 142A and 144A are shown in the embodiment, the number and arrangements are not limited thereto. In some embodiment, the second support portion 140A may include additional rows of support pillars 142A and/or support pillars 144A. In some embodiments, the second support portion 140A may include only support pillars 142A or support pillars 144A arranged in an array. Like the second support portion 120B, the second support portion 140A may have at least a portion extending beyond an edge of the semiconductor die 200 stacked thereon.

Figure 13:
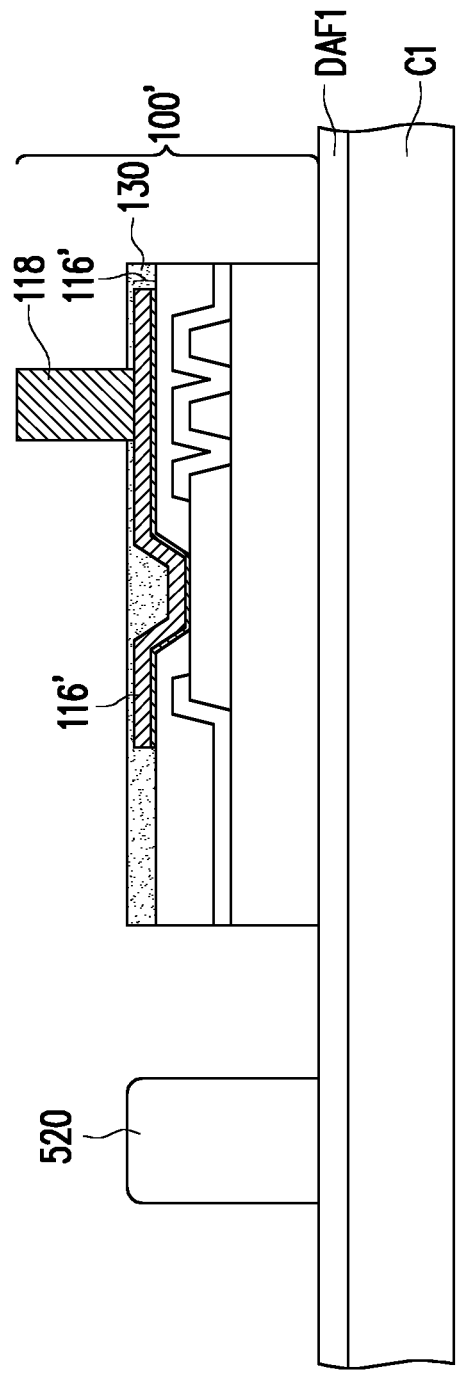
FIGS. 13 through 17 illustrate cross-sectional views of various processing steps during formation of a chip package in accordance with some embodiments.

FIGS. 13 through 17 illustrate cross-sectional views of various processing steps during formation of a chip package in accordance with another embodiment. Referring to FIG. 13, a semiconductor die 100' is attached to the carrier C1 through the die-attach film DAF1. The difference between the semiconductor die 100' and semiconductor die 100 of FIGS. 1 through 12 lies in a dielectric layer 130 being formed over the semiconductor die 100' during the wafer processing stage. That is, after the conductive materials 116 are formed in the openings of the patted photoresist PR1 described above with reference to FIG. 2, the photoresist PR1 and portions of the seed layer SL not covered by the conductive material 116 are both removed to form the conductive lines 116'. Next, the dielectric layer 130 is deposited over the dielectric layer 112 and the conductive lines 116'. The dielectric layer 130 is then patterned to form openings that reveal portions of the conductive lines 116'. In some embodiments. the dielectric layer 130 may be formed of the same material as the dielectric layer 112. After patterning the dielectric layer 130, the photoresist PR2 described with reference to FIG. 3 is formed over the pattern dielectric layer 130 and patterned to form openings over the openings of the dielectric layer 130 to reveal the conductive lines 116'. The conductive pillars 118 are then formed on the conductive lines 116' in the openings of the photoresist PR2. Stripping process of the photoresist PR2 and singulation process of the semiconductor die 100' may be similar to the description of FIG. 4 and FIG. 5 described above.

In some embodiments, the dielectric layer 130 may have sufficient thickness to encapsulate and protect the conductive lines 116'. In some embodiments, the top surface of the dielectric layer 130 may be substantially leveled to facilitate the stacking of the semiconductor die 200. A dielectric structure 520 similar to the second support portion 120B described above is then deposited on the die-attach film DAF1 beside the semiconductor die 100' to a height substantially leveled with the top surface of the dielectric layer 130. Due to the dielectric layer 130 being formed over the dielectric layer 112 and the conductive lines 116', and has a substantially leveled top surface, the dielectric structure 520 is only formed beside the semiconductor die 100'. That is, a support portion similar to the first support portion 120A described above is not formed on the semiconductor die 100'. The dielectric structure 520 may be formed using the same 3D printing process and the same material as the dielectric structure 120 described above, details of which are not repeated herein. In some embodiments, the dielectric structure 520 may be formed to have similar shape as the second support portion 120B, 140C or 140D, or to include multiple support structures (e.g. pillars and fins) such as the second support portion 140A or 140B. In some embodiments, the first support portion 120A of FIG. 6A may be formed over the dielectric layer 130, and the second support portion 520 is then formed to the level of the first support portion 120A instead of the level of the top surface of dielectric layer 130.

Figure 14:
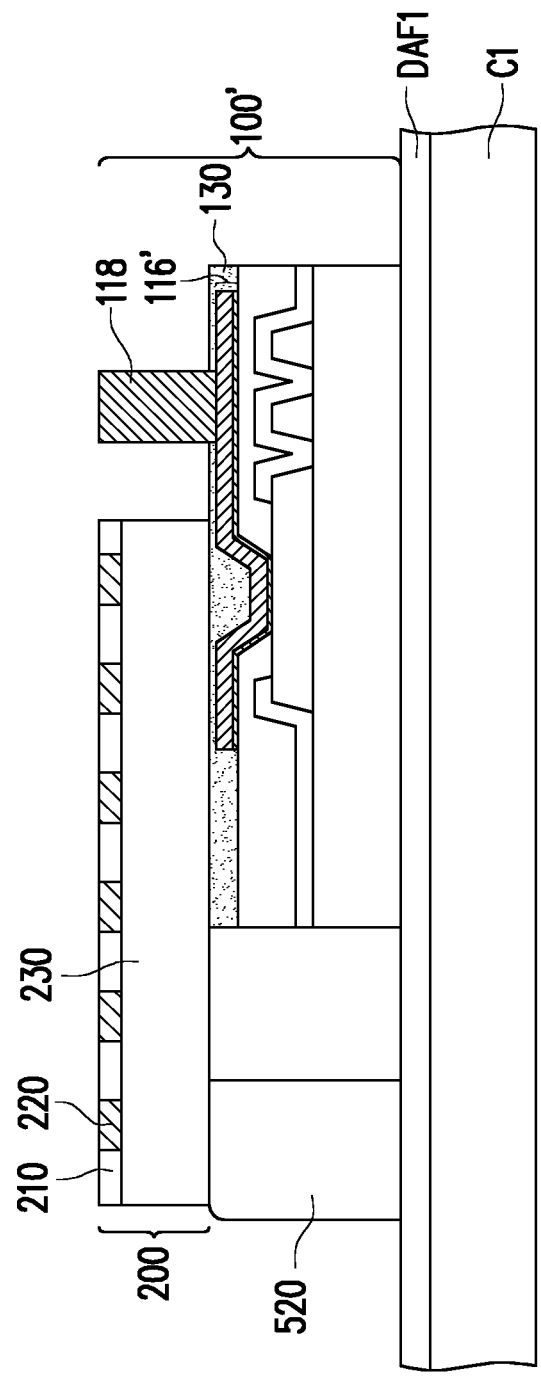
Figure 15:
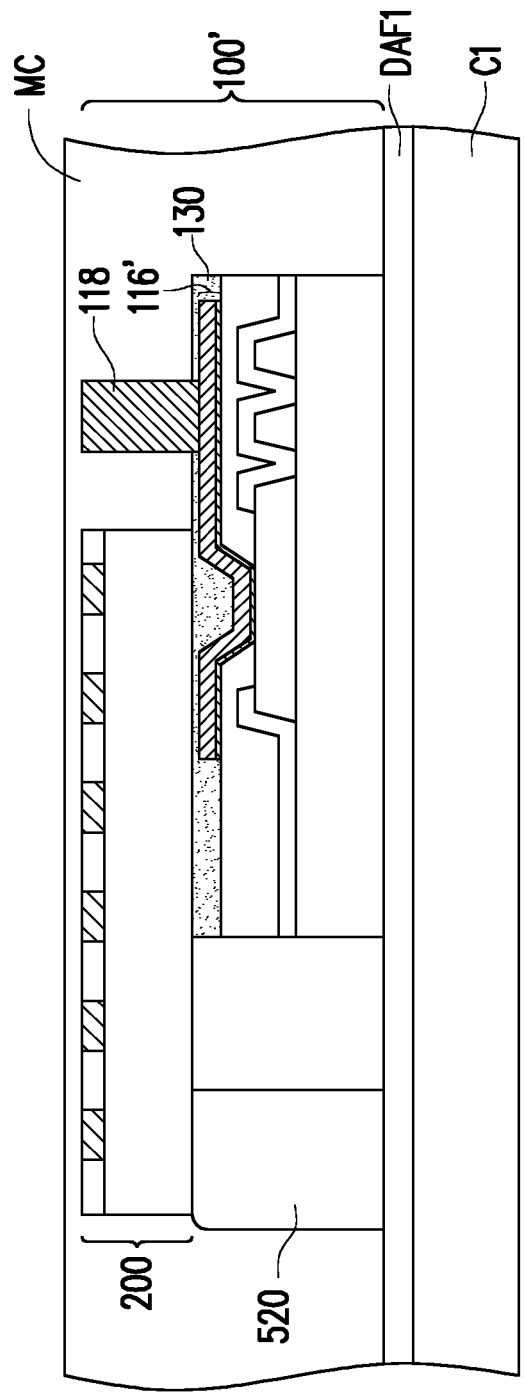

In FIG. 14, the semiconductor die 200 is stacked on the dielectric layer 130 and the dielectric structure 520, and positioned beside the conductive pillars 118. Next, referring to FIG. 15, the insulating encapsulant MC is deposited to fully encapsulate the semiconductor die 100', semiconductor die 200, and the dielectric structure 520, similar to the description with reference to FIG. 8 above. The insulating encapsulant MC may completely fill the spaces under the semiconductor die 200, the gap between the semiconductor die 200 and the conductive pillars 118, and the gaps between each of the conductive pillars 118. Due to the conductive lines 116' being covered by the dielectric layer 130, none of the conductive lines 116' are in direct contact with the insulating encapsulant MC. The insulating encapsulant MC may be a molding compound, epoxy, or the like, and may be applied by a molding process (e.g. compression molding, transfer molding, or the like).

Figure 16:
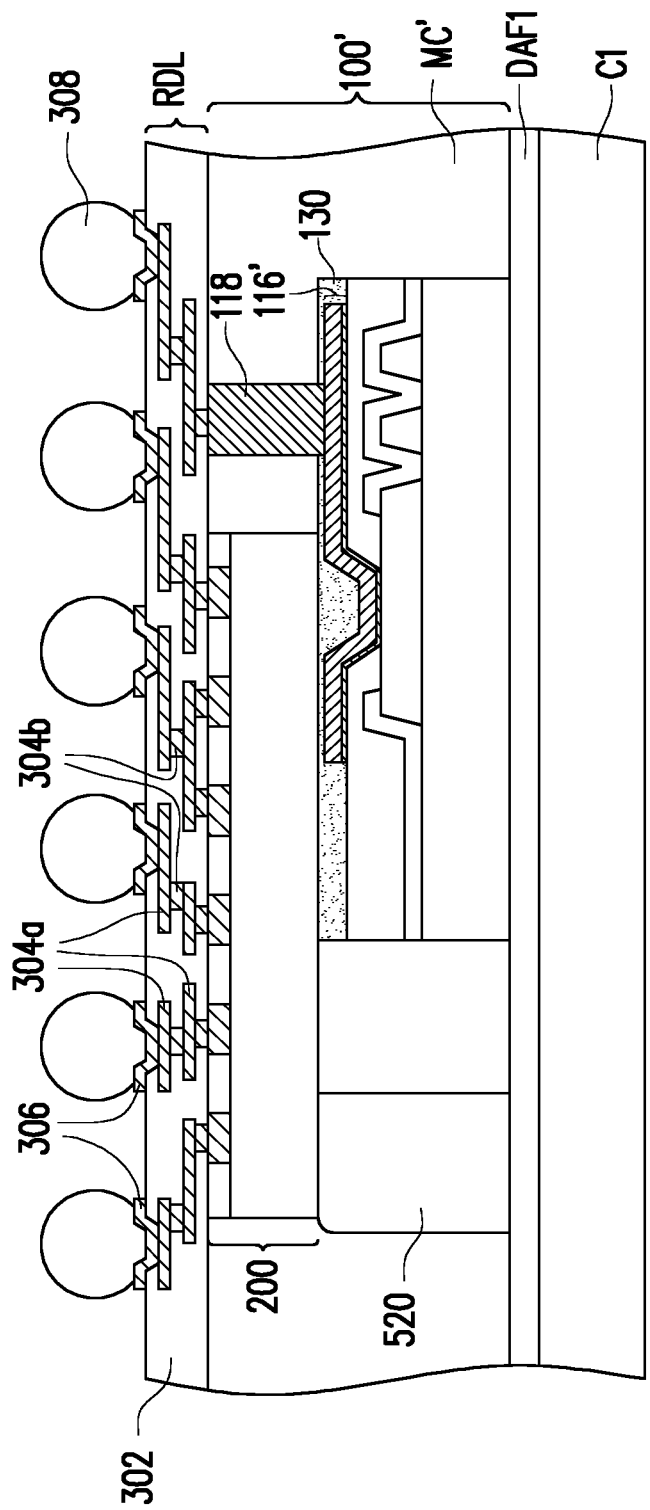
Figure 17:
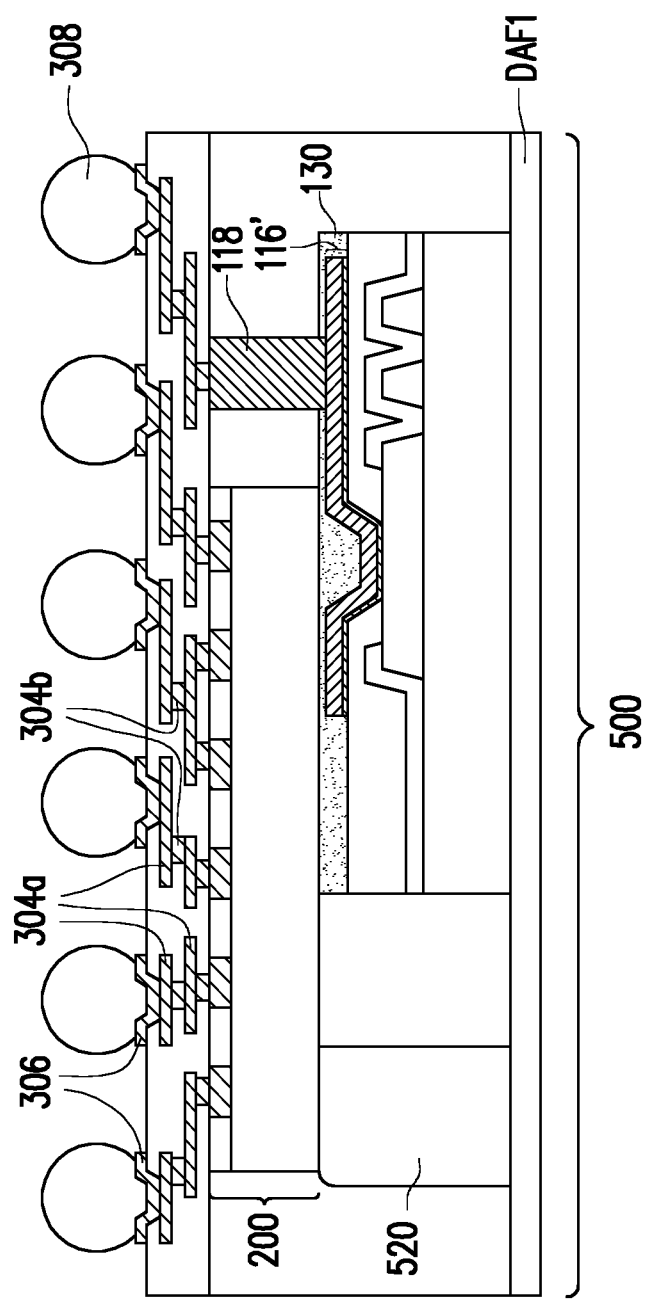

In FIG. 16, the molding compound MC is partially removed to expose the semiconductor die 200 and conductive pillars 118. In some embodiment, when the conductive pillars 118 is taller than the top surface of the semiconductor die 200, the conductive pillars 118 is also partially removed. Preferably, the top surface of the remaining insulating encapsulant MC' is substantially leveled with the exposed top surfaces of the semiconductor die 200 and the conductive pillars 118. The partial removal of the insulating encapsulant MC may be performed by a grinding process and/or a planarization process such as a chemical mechanical polishing (CMP) process. The redistribution circuit structure RDL is then formed on the top surfaces of the conductive pillars 118, the top surface of the insulating encapsulation MC', and the top surface of the semiconductor dies 200 to electrically connect with the semiconductor die 200 and the conductive pillars 118 embedded in the insulating encapsulant MC'. Furthermore, the conductive pillars 118 may be electrically connected to the semiconductor die 200 through the redistribution circuit structure RDL. After forming the redistribution circuit structure RDL, a plurality of conductive features electrically connected to the redistribution circuit structure RDL are formed. Here, the conductive features may include under-bump metallurgies (UBM) 306 and conductive connectors 308 formed on the UBM 306. Details of the redistribution circuit structure RDL, the UBM 306 and conductive connectors are provided above with reference to FIG. 9 and are not repeated herein. After forming the conductive connectors 306, the carrier C1 may be detached from the package wafer and individual chip packages having at least one semiconductor die 100 and at least one semiconductor die 200 packaged therein may be singulated to form a chip package 500 with a front side redistribution structure RDL, as shown in FIG. 17.

In view of the above, a 3-D printing process is used to form dielectric structures with adhesive properties to facilitate the stacking of top die (i.e. semiconductor die 200) over a bottom die (i.e. semiconductor die 100). By using the 3-D printing process, supporting portions of the dielectric structure may be printed on the bottom die and/or on the carrier beside the bottom die. This allows greater flexibility in providing support portions of different shapes, sizes, and numbers with sufficient gaps from nearest support portions and/or bottom die. Moreover, providing sufficient gaps between each of the support portions and bottom die will allow the insulating encapsulant material to be easily flowed through each of these gaps to fully fill up all the spaces between support portions and the bottom die, even after the top die is stacked over the bottom die and the support portions. Therefore, only a single encapsulation process is needed in the packaging process of the stacked top and bottom dies. By stacking the top die over the bottom die with front sides (i.e. side with I/O pads) of both the top die and the bottom die facing the same direction, a chip package having a smaller footprint and a shorter electrical connection path is achieved. That is, the conductive pillars is disposed right beside the top die to provide a short electrical path between the top die and the bottom die.

In accordance with some embodiments of the present disclosure, a chip package includes: a first semiconductor die having a top surface having a first region and a second region; conductive pillars disposed over the second region of the first semiconductor die; a dielectric structure having a first support portion and a second support portion, the first support portion being disposed on the first region of the first semiconductor die, and the second support portion being physically separated from the first semiconductor die; a second semiconductor die stacked over the first support portion and the second support portion, and the second semiconductor being electrically connected to the first semiconductor die through the conductive pillars; and an insulating encapsulant encapsulating the first semiconductor die, the second semiconductor die, the dielectric structure and the conductive pillars.

In accordance with some embodiments of the present disclosure, chip package includes: an insulating encapsulant; a first semiconductor die embedded in the insulating encapsulant, the first semiconductor die comprising an active surface, a dielectric layer over the active surface, and conductive features disposed between the first dielectric layer and the active surface; a plurality of dielectric pillars embedded in the insulating encapsulant, the plurality dielectric pillars being separated from one another and from the first semiconductor die; a plurality of conductors disposed on the conductive features and embedded in the insulating encapsulant; a second semiconductor die embedded in the insulating encapsulant, the second semiconductor die comprising an active surface and a bottom surface opposite to the active surface, the bottom surface being in contact with the dielectric layer and the plurality of dielectric pillars, and the plurality of conductors and the second semiconductor die are being spaced apart by the insulating encapsulant; and a redistribution circuit structure disposed over the active surface of the second semiconductor die, the insulating encapsulant and the conductors, wherein the second semiconductor die is electrically connected to the first semiconductor die through the redistribution circuit structure and the conductors.

In accordance with alternative embodiments of the present disclosure, a method of forming a chip package is provided. The method includes the following steps: providing a first semiconductor die on a carrier, the first semiconductor die comprising a first region and a second region, depositing a dielectric structure on the carrier, stacking a second semiconductor die over the dielectric structure and the first region of the first semiconductor die to expose the second region of the second semiconductor die, encapsulating the first semiconductor die, the second semiconductor die and the dielectric structure with an insulating encapsulant, wherein the second semiconductor die is electrically connected to the first semiconductor die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A chip package, comprising:
a first semiconductor die comprising a top surface having a first region and a second region; conductive pillars disposed over the second region of the first semiconductor die;
a dielectric structure comprising a first support portion and a second support portion, the first support portion being disposed on the first region of the first semiconductor die, and the second support portion being physically separated from the first semiconductor die;
a second semiconductor die stacked over the first support portion and the second support portion, and the second semiconductor die being electrically connected to the first semiconductor die through the conductive pillars; and
an insulating encapsulant encapsulating the first semiconductor die, the second semiconductor die, the dielectric structure and the conductive pillars.

2. The chip package according to claim 1, wherein the first semiconductor die and the second support portion are spaced apart by a portion of the insulating encapsulant, and a portion of a bottom surface of the second semiconductor die contacts with the portion of the insulating encapsulant.

3. The chip package according to claim 1, wherein a top surface of the first support portion is substantially level with a top surface of the second support portion, and a bottom surface of the second support portion is substantially level with a bottom surface of the first semiconductor die.

4. The chip package according to claim 1, wherein two corners of a bottom surface of the second semiconductor die are in contact with the second support portion.

5. The chip package according to claim 1, wherein the first semiconductor die further comprises conductive features under the first support portion, the conductive features extend from the first region to the second region, and the conductive pillars are disposed on conductive features over the second region.

6. The chip package according to claim 5, wherein a portion of the conductive features in the second region contacts the insulating encapsulant.

7. The chip package according to claim 1, further comprising a redistribution circuit structure disposed over the second semiconductor die, the insulating encapsulant and the conductive pillars, wherein the second semiconductor die is electrically connected to the first semiconductor die through the redistribution circuit structure and the conductive pillars.

8. The chip package according to claim 1, wherein the second support portion comprises a plurality of support pillars spaced apart from one another by the insulating encapsulant.

9. The chip package according to claim 8, wherein two of the plurality of support pillars are in contact with two corners of the second semiconductor die.

10. The chip package according to claim 1, wherein a portion of the dielectric structure contacts a sidewall of the second semiconductor die.

11. The chip package according to claim 1, wherein the first support structure comprises a same material as the second support portion.

12. A chip package, comprising:
an insulating encapsulant;
a first semiconductor die embedded in the insulating encapsulant, the first semiconductor die comprising an active surface, a dielectric layer over the active surface, and conductive features disposed between the first dielectric layer and the active surface;
a plurality of dielectric pillars embedded in the insulating encapsulant, the plurality dielectric pillars being separated from one another and from the first semiconductor die;
a plurality of conductors disposed on the conductive features and embedded in the insulating encapsulant;
a second semiconductor die embedded in the insulating encapsulant, the second semiconductor die comprising an active surface and a bottom surface opposite to the active surface, the bottom surface being in contact with the dielectric layer and the plurality of dielectric pillars, and the plurality of conductors and the second semiconductor die are being spaced apart by the insulating encapsulant; and
a redistribution circuit structure disposed over the active surface of the second semiconductor die, the insulating encapsulant and the conductors, wherein the second semiconductor die is electrically connected to the first semiconductor die through the redistribution circuit structure and the conductors.

13. The chip package according to claim 12, wherein a distance between the first semiconductor die and an immediately adjacent dielectric pillar of the plurality of dielectric pillars is between about 100 µm to about 3000 µm.

14. The chip package according to claim 12, wherein a distance between immediately adjacent pairs of the plurality of dielectric pillars is between about 100 µm to about 3000 µm.

15. The chip package according to claim 12, wherein one dielectric pillar of the plurality of the dielectric pillars contacts a sidewall of the second semiconductor die.

16. A method of forming a chip package, comprising:
providing a first semiconductor die on a carrier, the first semiconductor die comprising a first region and a second region,
depositing a dielectric structure on the carrier,
depositing a dielectric layer on the first semiconductor die over the first region, wherein a top surface of the dielectric layer is substantially level with a top surface of the dielectric structure,
stacking a second semiconductor die over the dielectric structure and the first region of the first semiconductor die to expose the second region of the second semiconductor die, and
encapsulating the first semiconductor die, the second semiconductor die and the dielectric structure with an insulating encapsulant, wherein the second semiconductor die is electrically connected to the first semiconductor die.

17. The method for forming a chip package as claimed in claim 16, wherein the dielectric layer is spaced apart from the dielectric structure.

18. The method for forming a chip package as claimed in claim 16, wherein the dielectric structure and the dielectric layer is deposited using a 3-dimensional printing process.

19. The method for forming a chip package as claimed in claim 16, wherein depositing the dielectric structure on the carrier comprises:
depositing an adhesive on the carrier, and
curing the adhesive to form the dielectric structure.

20. The method for forming a chip package as claimed in claim 19, wherein stacking the second semiconductor die over the dielectric structure comprises:
placing the second semiconductor die on the adhesive before curing the adhesive to form the dielectric structure.

* * * * *